United States Patent
Al Ahmad et al.

(10) Patent No.: US 12,507,596 B1
(45) Date of Patent: Dec. 23, 2025

(54) DEVICES WITH PIEZOELECTRIC ELEMENTS AND METHOD FOR USING PIEZOELECTRIC ELEMENTS

(71) Applicant: United Arab Emirates University, Al Ain (AE)

(72) Inventors: Mahmoud F. Y. Al Ahmad, Al Ain (AE); Abdulrahman Mohamed, Al Ain (AE)

(73) Assignee: United Arab Emirates University (AE)

( * ) Notice: Subject to any disclaimer, the term of this patent is extended or adjusted under 35 U.S.C. 154(b) by 0 days.

(21) Appl. No.: 19/064,489

(22) Filed: Feb. 26, 2025

(51) Int. Cl.
*H01L 41/107* (2006.01)
*H10N 30/40* (2023.01)
*H10N 30/50* (2023.01)
*H10N 30/87* (2023.01)

(52) U.S. Cl.
CPC .............. *H10N 30/40* (2023.02); *H10N 30/50* (2023.02); *H10N 30/871* (2023.02)

(58) Field of Classification Search
CPC ................................ H10N 30/40; H10N 30/50
See application file for complete search history.

(56) References Cited

U.S. PATENT DOCUMENTS

| | | | |
|---|---|---|---|
| 5,504,384 A | 4/1996 | Lee | |
| 5,701,049 A | 12/1997 | Kanayama | |
| 5,929,554 A * | 7/1999 | Kanayama | H10N 30/40 310/366 |
| 6,084,336 A * | 7/2000 | Kawasaki | H10N 30/40 310/366 |
| 6,124,678 A * | 9/2000 | Bishop | H05B 41/2822 315/276 |
| 2003/0163908 A1* | 9/2003 | Kaji | H04R 17/00 29/25.35 |
| 2007/0103036 A1* | 5/2007 | Nakagawa | H10N 30/40 310/359 |
| 2010/0038996 A1* | 2/2010 | Xu | H02N 2/103 29/25.35 |

FOREIGN PATENT DOCUMENTS

SU 738014 A1 5/1980

\* cited by examiner

*Primary Examiner* — Bryan P Gordon
(74) *Attorney, Agent, or Firm* — Knobbe Martens Olson & Bear LLP

(57) ABSTRACT

The present invention relates to electrical devices (1, 10, 11) comprising piezoelectric elements (1a, 1b, 10a, 11a) formed in a variety of known geometrical shapes and polling directions. The present invention is based on the inventive concept of switching place between the set of output electrodes (20a, 21a) and the set of output electrodes (20b, 21b) to enable for a significant increase in step-up conversion in comparison to the conventional electrode arrangement used in known piezoelectric transformers.

16 Claims, 6 Drawing Sheets

DEVICES WITH PIEZOELECTRIC ELEMENTS AND METHOD FOR USING PIEZOELECTRIC ELEMENTS

TECHNICAL FIELD

Embodiments herein relate to electrical devices and methods incorporating piezoelectric elements for electrical transformation.

BACKGROUND

Piezoelectric transformers have become a crucial component in various modern applications due to their ability to efficiently convert electrical energy through mechanical vibrations. These devices are widely used in applications requiring compact designs, high-voltage generation, and reliable performance, such as power supplies for electronic devices, medical equipment, and lighting systems. Among the various configurations, the Rosen-type transformer is a well-established design, known for its operational simplicity and effectiveness in achieving resonance at relatively low frequencies.

SUMMARY OF INVENTION

The resonance frequency of a piezoelectric transformer plays a vital role in determining its performance characteristics, including power transfer efficiency and voltage gain. Traditionally, the resonance frequency is dictated by the geometric dimensions and intrinsic material properties of the transformer, limiting its adaptability for applications that demand higher frequencies. Higher resonance frequencies are often desired in scenarios where faster response times, reduced size, or higher energy transfer efficiency is critical, such as in high-frequency switching circuits or advanced wireless charging systems.

Despite the established performance of conventional configurations, there remains a gap in achieving higher resonance frequencies without fundamentally altering the transformer's material or structural composition. The inventor has surprisingly discovered that modifying the electrical connection arrangement of a conventional Rosen-type piezoelectric transformer while maintaining the same physical structure results in a significantly increase of the resonance frequency, thus unlocking new opportunities for piezoelectric transformer applications in frequency-sensitive environments.

The present invention according to a first and second aspect as recited in claims 1 and 9 respectively demonstrates the ability to shift the resonance frequency of a commercially available Rosen-type piezoelectric transformer from 67 kHz to 262 kHz. This innovative approach not only enhances the transformer's versatility but also addresses the growing demand for higher-frequency operations in modern electronic systems.

According to the first aspect of the invention, there is proposed an electrical device comprising a piezoelectric element with a height dimension, a length dimension, and a width dimension. The piezoelectric element has a primary section and a secondary section. The primary section is polarized along the height dimension from a first face to a second face, i.e., in a direction parallel to the height dimension, while the secondary section is polarized along the length dimension, i.e., in a direction parallel to the length dimension. The piezoelectric element may for example be formed as a rectangular plate, with the primary section polarized in a thickness direction and the secondary section polarized in a longitudinal direction. However, alternative shapes or proportions are possible, including cylinders, prisms, irregular geometric shapes, or other configurations in which the relevant polarizations can be established.

According to the second aspect, there is proposed a method for using a piezoelectrical transformer. The transformer comprises a piezoelectric element having a height dimension, a length dimension, and a width dimension. The piezoelectric element includes a primary section and a secondary section, with the primary section polarized in a direction parallel to the height dimension from a first face to a second face, and the secondary section polarized in a direction parallel to the length dimension. A set of input electrodes and a set of output electrodes are arranged on opposite faces of the primary section, while a ground electrode is arranged on the secondary section.

The method at least comprises:
applying an input AC-voltage to be transformed to the set of input electrodes and the set of ground electrodes; and
extracting an output voltage from the set of output electrodes.

A set of input electrodes and a set of output electrodes are arranged on opposite faces of the primary section, while a set of ground electrodes is arranged on the secondary section. An AC-voltage source is operatively connected to the set of input electrodes and the set of ground electrodes, and an electrical load is coupled to the set of output electrodes.

In a conventional Rosen-type configuration the resonance frequency and the required set-up/down voltage are primarily determined by the physical dimensions and material properties of the transformer. However, by implementing the proposed configuration, a significant upward shift in the resonance frequency of the same structure can be achieved. For instance, in the case of a commercially available piezoelectric transformer using the conventional Rosen-type configuration, the resonance frequency is typically 67 kHz, as illustrated in FIG. 9. When modified to the proposed configuration, the resonance frequency increases significantly to 262 kHz, as illustrated in FIG. 10.

Based on this realization, a variety of electrical devices incorporating known piezoelectric geometrics with novel electrode arrangements have been developed, including electrical devices according to a third, fourth and fifth aspect as defined in claims 2, 10 and 13 respectively.

According to the third aspect there is proposed an electrical device comprising a piezoelectric element defining a height dimension, a length dimension transverse to the height dimension, and a width dimension transverse to both the height and length dimensions. The piezoelectric element includes a primary section and a secondary section. The primary section comprises multiple piezoelectric layers polarized in a direction parallel to the height dimension, while the secondary section is polarized in a direction parallel to the length dimension. A set of input electrodes and a set of output electrodes are interleaved between the multiple piezoelectric layers, and at least one ground electrode is disposed on the secondary section. The electrical device further comprises an AC-voltage source operatively connected to the set of input electrodes and the set of ground electrodes, and an electrical load coupled to the set of output electrodes.

According to the fourth aspect there is proposed an electrical device comprising a piezoelectric element defining a height dimension, a length dimension transverse to the height dimension, and a width dimension transverse to both the height and length dimensions. In certain embodiments, the piezoelectric element may be formed as a rectangular plate or as a cylinder, with a boundary illustrating where the primary section and the secondary section meet. However, various other geometrical shapes or proportions are also possible, including cylinders, prisms, or irregular geometrical shapes, and the relative sizes of the primary and secondary sections may vary. The piezoelectric element comprises a set of piezoelectric layers polarized in a direction parallel to the height dimension. A set of input electrodes and a set of output electrodes are arranged on the primary section, while a set of ground electrodes is arranged on the secondary section. The electrical device further comprises an AC-voltage source operatively connected to the set of input electrodes and the set of ground electrodes, and an electrical load coupled to the set of output electrodes.

According to the fifth aspect there is proposed an electrical device comprising a first piezoelectric element coupled to a second piezoelectric element. Together, these elements define a height dimension, a length dimension transverse to the height dimension, and a width dimension transverse to both the height and length dimensions. Each of the first and second piezoelectric elements includes a set of piezoelectric layers polarized and stacked in a direction parallel to the height dimension. A set of input electrodes and a set of output electrodes are arranged on the primary section of the first piezoelectric element, while a set of ground electrodes is arranged on the secondary section of the second piezoelectric element. The electrical device further comprises an AC-voltage source operatively connected to the set of input electrodes and the set of ground electrodes, and an electrical load coupled to the set of output electrodes.

BRIEF DESCRIPTION OF FIGURES

Further objects and advantages, as well as technical features of the invention will become apparent through the following description of one or several embodiments given with reference to the appended figures, where.

DETAILED DESCRIPTION

Embodiments herein will be described in more detail below with reference to the appended figures, in which examples of embodiments are shown. Embodiments herein are not limited to the described examples of embodiments; they are rather defined by the appended patent claims.

Figure 1:
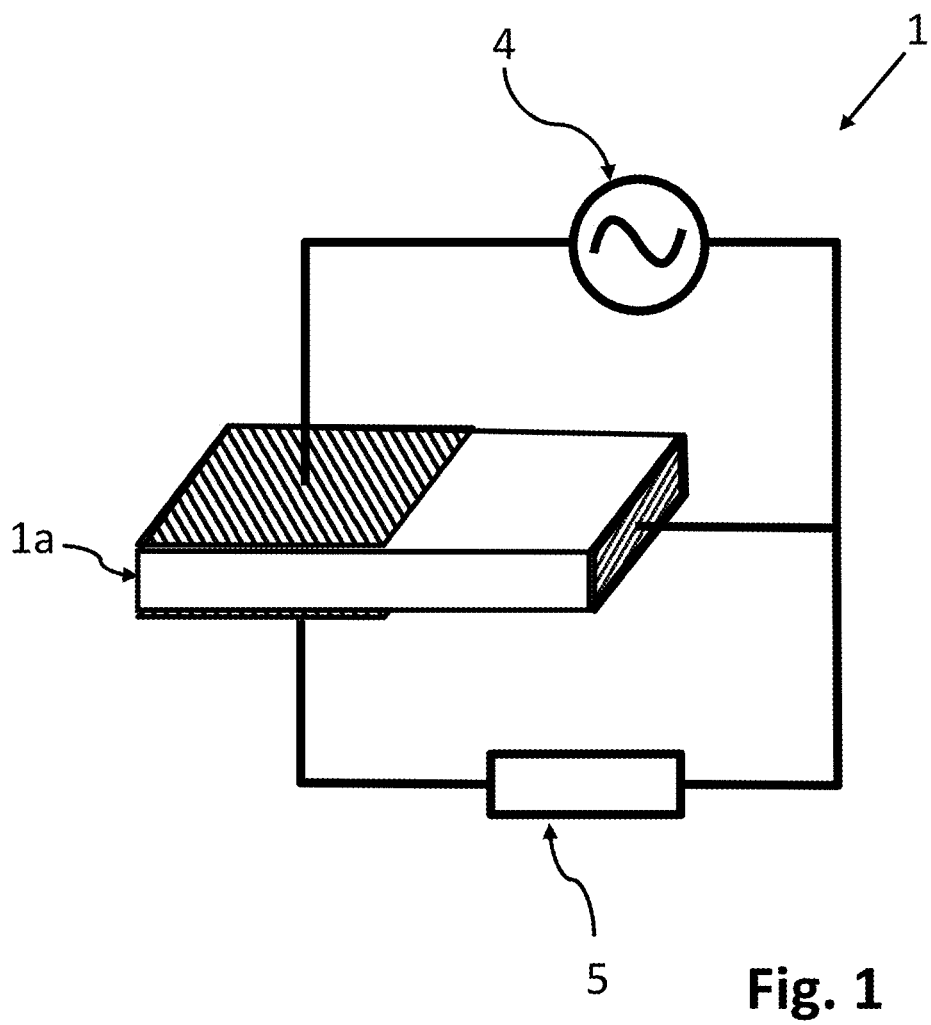
FIG. 1 shows a schematic illustration of a electrical device according to embodiments relating to the first aspect of the present invention.
Figure 2:
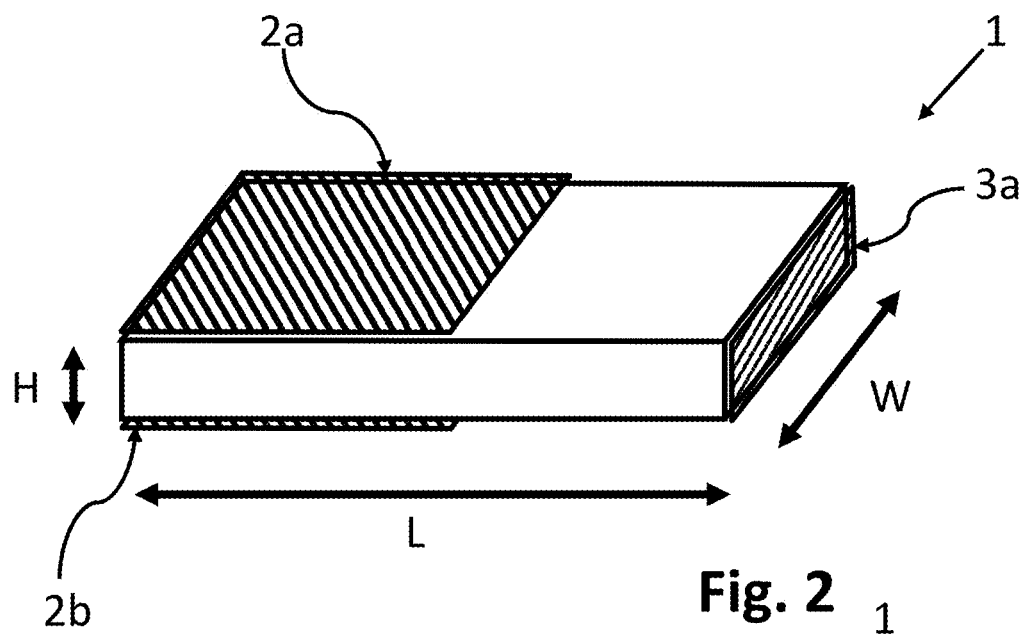
FIGS. 2 and 3 show a schematic illustration of a piezoelectric according to embodiments relating to the first aspect of the present invention.
Figure 3:
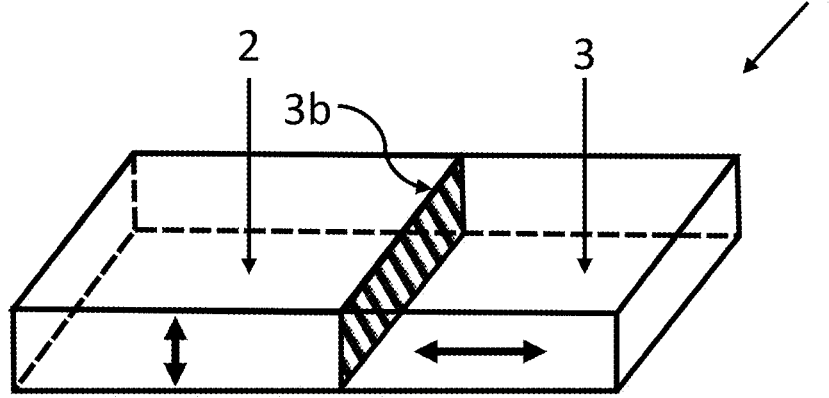

According to a first aspect of the present invention illustrated in FIGS. 1,2 and 3, there is proposed an electrical device 1 comprising a piezoelectric element 1a having a height dimension H, length dimension L and width W. The piezoelectric element 1a has a primary section 2 and a secondary section 3.

In other words, the piezoelectric element 1a defines a length dimension L, a width L dimension transverse to the length dimension L direction and a height dimension H dimension transverse to both the length dimension L and width dimension W dimension.

As illustrated by the arrows in FIG. 3, the primary section 2 is polarized along the height dimension H from a first face 2a to a second face 2b, i.e., the primary section 2 is polarized in a direction parallel to the height dimension H. The secondary section 3 is polarized along the length L, i.e., it is polarized in a direction parallel to the length dimension L. In the illustrated embodiment, the piezoelectric element 1a is formed as a rectangular plate and the primary section 2 is polarized in a thickness direction while the secondary section 3 is polarized in the longitudinal direction. As the skilled person understands, several other configurations not illustrated are possible, e.g., the width L and height W and length dimension L may be of similar linear measurement and/or the piezoelectric element 1a may be formed as a cylinder, prism, an irregular geometrical shape or any other shape.

A set of input electrodes and a set of output electrodes are arranged on the piezoelectric element 1a. The set of input electrodes and set of output electrodes are arranged on opposite faces of the primary section 2. Additionally, a set of ground electrodes is arranged on the secondary section 3.

The electrical device 1 further comprises an AC-voltage source 4 which is operatively connected to the set of input electrodes and the set of ground electrodes. An electrical load 5 is coupled to the set of output electrodes.

In one embodiment, the set of input electrodes are disposed on either the first face 2a or the second face 2b and the set of output electrodes are disposed on the face opposite the face on which the set of input electrodes are arranged.

In embodiment according to the first aspect, the set of input electrodes, set of output electrodes and set of ground electrodes are composed by one electrode respectively.

In preferred embodiments according to the first aspect, the set of input electrodes and set of output electrodes are arranged to partially cover the first face 2a and second face 2b. In other words, the set of input electrodes cover only a part of the first face 2a or second face 2b In further embodiments, the set of ground electrodes are arranged to partially cover the third face.

Figure 4:
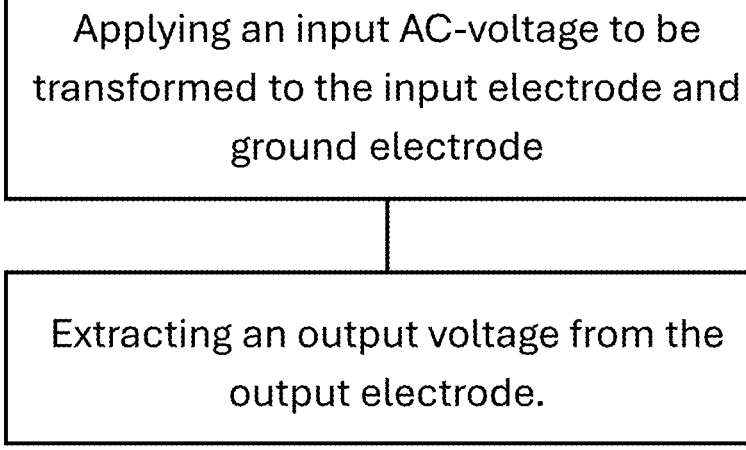
FIG. 4 shows activities to be performed according to a second aspect of the present invention.

According to a second aspect of the present invention, illustrated in FIG. 4, there is proposed a method for using a piezoelectrical transformer. The piezoelectric transformer comprising a piezoelectric element 1a having a height dimension H, length dimension L and width dimension W. The piezoelectric element 1a comprises a primary section 2 and a secondary section 3. The primary section 2 is polarized in a direction parallel to the height dimension H from a first face 2a to a second face 2b. The secondary section 3 is polarized in a direction parallel to length dimension L. An set of input electrodes and an set of output electrodes are arranged on the piezoelectric element 1a. The set of input electrode and the set of output electrode are arranged on opposite faces of the primary section. Additionally, a ground electrode is arranged on the secondary section 3. The method according to the second aspect comprises at least the steps of:

applying an input AC-voltage to be transformed to the set of input electrodes and the set of ground electrodes; and, extracting an output voltage from the set of output electrode.

As understood by the skilled person, the piezoelectric element 1a according to the second aspect may be any piezoelectric element 1a according to embodiments of the first aspect of the present invention.

Figure 5:
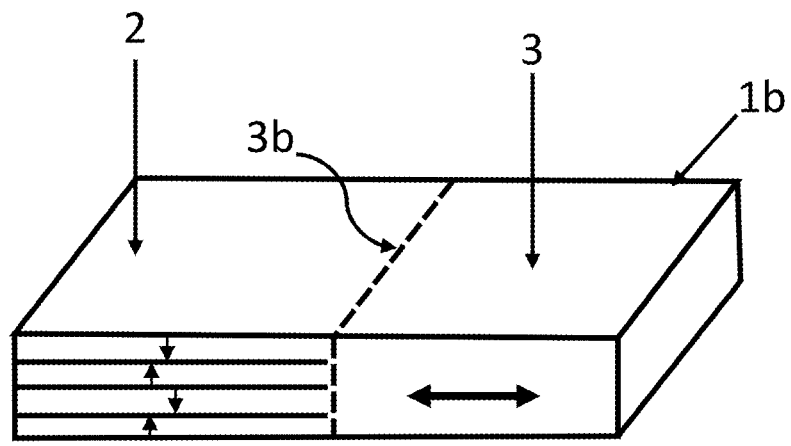
FIG. 5 show a schematic illustration of a electrical device according to embodiments relating to the third aspect of the present invention.

In a third aspect of the present invention illustrated on FIG. 5 there is proposed an electrical device 1 comprising a piezoelectric element 1c defining: a height dimension H; a length dimension L transverse to the height dimension H; and, a width dimension W transverse to both the length dimension L and height dimension H. The piezoelectric element 1c comprises a primary section 2 and a secondary section 3. The primary section 2 comprises multiple piezoelectric layers polarized in a direction parallel to the height dimension H. The secondary section 3 is polarized in a direction parallel to the length dimension L. The piezoelectric element 1c comprises a set of input electrodes and a set of output electrodes. The set of input electrodes and the set of output electrodes are interleaved between said multiple piezoelectric layers. At least one ground electrode is disposed on the secondary section 3. The electrical device 1 further comprises:

an AC-voltage source 4 operatively connected to the set of input electrodes and set of ground electrodes; and, an electrical load 5 coupled to the set of output electrodes.

As understood by the skilled person, the electrical load 5 according to the second aspect may comprise of several electrical loads operatively connected to one or several amongst a plurality of electrodes within the set of output electrodes.

The piezoelectric element 1c according to the third aspect is substantially the same as the piezoelectric element 1a according to the first aspect or second aspect but differs in that the primary section 2 has multiple piezoelectric layers instead of only a single piezoelectric layer and that the set of input electrodes and that the set of output electrodes are interleaved between said multiple piezoelectric layers as opposed to there only being a set of input electrodes and set of output electrodes arranged on opposite faces on the primary section 2. Consequently, the below recited embodiments relate to both the first aspect and the second aspect of the present invention.

When multiple piezoelectric layers are incorporated it may be preferable that the polarization direction alternates between each adjacent piezoelectric layer as illustrated in FIG. 5 by the arrows parallel to the height W.

The piezoelectric element 1a, 1b may be a single crystal material such as quarts, polycrystalline material such as lead-based ceramic or lead-free ceramic material, a piezoelectric polymer such as polyvinylidene fluoride or a piezoelectric composite material.

The piezoelectric element 1a, 1b may be formed as a cuboid, i.e., a three-dimensional rectangle, e.g., a rectangular plate or bar.

In embodiments, the secondary section 3 is polarized along the length dimension L from a middle face 3b to the third face 3a. The middle face 3b being the longitudinal cross-section where the primary section 2 and secondary section 3 meet. In one alternative embodiment, the secondary section 3 is polarized along the length dimension L from the third face 3a to the middle face 3b.

The AC-voltage source 4 operative connection to the set of input electrodes and set of ground electrodes may realized by, for example, the electrical device 1 comprising a first conductor and a second conductor supplying an AC-voltage. The first conductor may be coupled to the set of input electrodes and the second conductor is coupled to the set of ground electrode.

In the embodiment illustrated in FIGS. 1,2 and 3, the set of ground electrodes may be disposed on a third face 3a which is the outermost face of the secondary section parallel to the width dimension W of the piezoelectric element 1a, 1c. In other words, the set of ground electrodes may be arranged on a third face 3a which is parallel to the width L of the piezoelectric element 1a and on the outermost face relative to the first section 2.

As also illustrated in the embodiment shown in FIG. 1, the piezoelectric element may be formed as a cuboid and wherein the length dimension L of the piezoelectric element 1a, 1c is greater than the width dimension W and wherein the width dimension W of the piezoelectric element 1a is greater than the height L.

Furthermore, in embodiments, the piezoelectric element 1a, 1c may be divided along its length dimension L into the primary section 2 and the secondary section 3. In FIG. 3 showing a embodiment according to the first aspect, a middle face 3b illustrates a cross-sectional face at the location of the primary section 2 and the secondary section 3 meet.

In embodiments, the AC-voltage source 4 is an inverter circuit operatively connected to the set of input electrodes and the set of ground electrodes. The inverter circuit is preferably configured to generate an AC voltage at or near the resonant frequency of the piezoelectric element 1a, 1b.

In further embodiments, the inverter circuit comprises: a Royer oscillator circuit; a half-bridge or full-bridge inverter circuit. The half-bridge or full-bridge inverter circuit may for example comprise MOSFET switching transistors.

In a further embodiment, the electrical device comprises a control circuit operatively connected to the inverter circuit. The control circuit may be configured to adjust at least one of: i the switching frequency of the inverter circuit; ii the pulse-width modulation PWM duty cycle of the inverter circuit; and iii a DC input voltage supplied to the inverter circuit.

In some embodiments, the control circuit comprises a feedback loop, the feedback loop comprising a current or voltage sensor operatively connected to sense a current or voltage flowing through a load connected to the output electrode. The current or sensor may for example comprise a series resistor.

According to embodiments, the electrical device further comprises an impedance matching network connected between an output of an amplifier circuit and the input electrode. The impedance matching network may preferably comprise an inductor-capacitor LC circuit.

In one preferred embodiment the ground electrodes is connected to a common ground potential.

In embodiments, the primary section 2 and secondary section 3 are composed by a single body.

Figure 6:
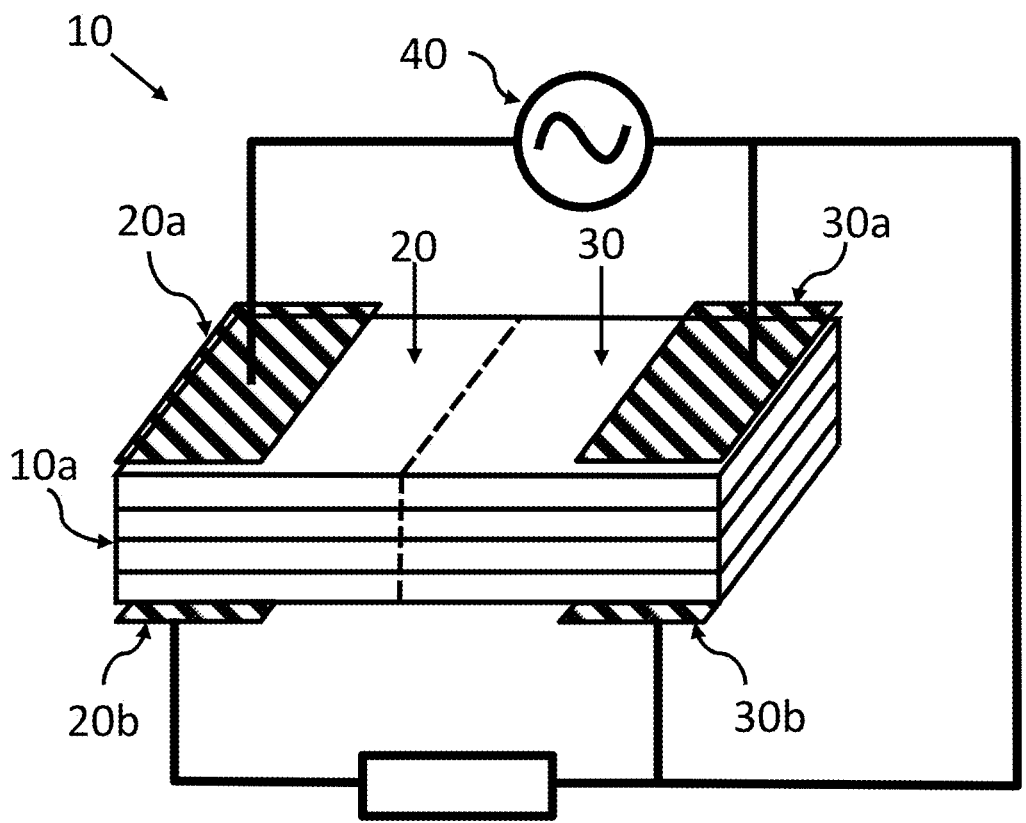
FIG. 6 show a schematic illustration of a electrical device according to a first set of embodiments relating to the fourth aspect of the present invention.
Figure 7:
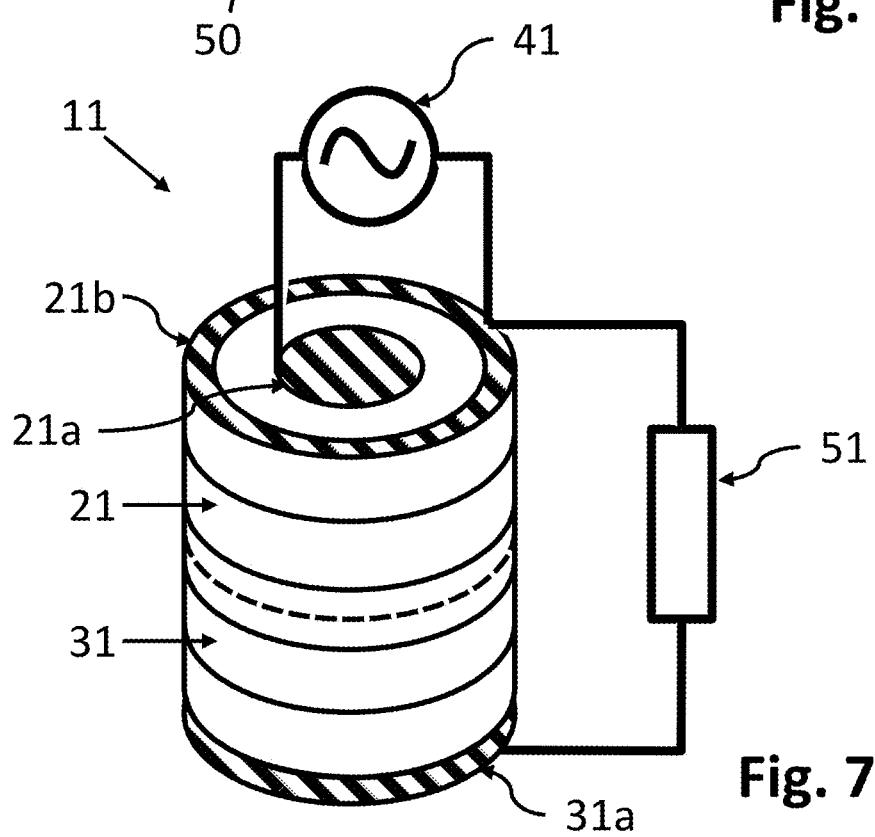
FIG. 7 show a schematic illustration of a electrical device according to second set of embodiments relating to the fourth aspect of the present invention.

According to a fourth aspect of the present invention illustrated in FIGS. 6 and 7 there is proposed an electrical device 10, 11 comprising a piezoelectric element 10a, 11a defining:
- a height dimension H;
- a length dimension L transverse to the height dimension H; and,
- a width dimension W transverse to both the length dimension L and height dimension H.

In the embodiment in FIGS. 6 and 7, the piezoelectric elements 10a, 11a are formed as a rectangular plate and cylinder respectively a dashed line illustrates the point at which the primary section 20, 21 and the secondary section 30, 31 meet. As the skilled person understands, several other configurations not illustrated are possible, e.g., the width L and height W and length dimension L may be of similar linear measurement and/or the piezoelectric element 10a may be formed as a cylinder, prism, an irregular geometrical shape or any other shape. In the illustration the primary section 20, 21 and secondary section 30, 31 are roughly the same size, however, as the skilled person understand this is only for illustrative purposes and several other configurations are possible.

The piezoelectric element 10a, 11a comprises a set of piezoelectrical layers polarized in a direction parallel to the height dimension H. The piezoelectric element 10a, 10a has a primary section 20, 21 and a secondary section 30, 31.

A set of input electrodes 20a, 21a and a set of output electrodes 20b, 21b are arranged on the primary section 20, 21 and a set of ground electrodes 30a, 30b, 31a are arranged on the secondary section 30, 31.

wherein the electrical device 10, 11 further comprises:
- an AC-voltage source 40, 41 operatively connected to the set of input electrodes 20a, 21a and the set of ground electrodes 30a, 30b, 31a; and,
- an electrical load 50, 51 coupled to the set of output electrodes 20b, 21b.

In preferred embodiments the piezoelectric layers are stacked in a direction parallel to the height dimension H as shown in the figures. Alternatively, the piezoelectric layers are stacked in the width dimension W or length dimension L.

In a first set of embodiments according to the fourth aspect illustrated in FIG. 6, the piezoelectric element 10a is formed as a cuboid and wherein the length dimension L of the piezoelectric element 1a is greater than the width dimension W and wherein the width dimension W of the piezoelectric element 10a is greater than the height dimension H. In other words, the piezoelectric element 10a is formed as a rectangular plate having a height H, length L and width W.

In one variation within the first set of embodiments, the piezoelectric element 10a is divided along its length dimension L into the primary section 20a and the secondary section 30.

The set of input electrodes 20a and the set of output electrodes 20b are then preferably arranged on opposite faces parallel to the length dimension L on the primary section 20a. The set of ground electrodes 30a, 30b may be arranged on at least one face parallel to the length dimension L on the secondary section 30.

In a second set of embodiments according to the fourth aspect there is proposed a piezoelectric element 11a. In embodiments, the piezoelectric element 11a may be formed as a cylinder as shown in FIG. 7. In alternative embodiments the piezoelectric element 11a may be formed as a rectangular plate, i.e., bar. As illustrated by the dashed line, the piezoelectric element 10b may be divided along its height dimension H into the primary section 21 and the secondary section 31. The set of input electrodes 21a and the set of output electrodes 20b are preferably arranged on the face parallel to width dimension W on the primary section 21. With this electrode configuration the set of ground electrodes 30a are preferably arranged on the face parallel to the width dimension W on the secondary section 31.

According to embodiments of the fourth aspect the set piezoelectric layers comprise only a single layer. Alternatively, the set piezoelectric layers comprise multiple layers as shown in FIGS. 6 and 7. When multiple piezoelectric layers are incorporated it may be preferable that the polarization direction alternates between each adjacent piezoelectric layer.

Figure 8:
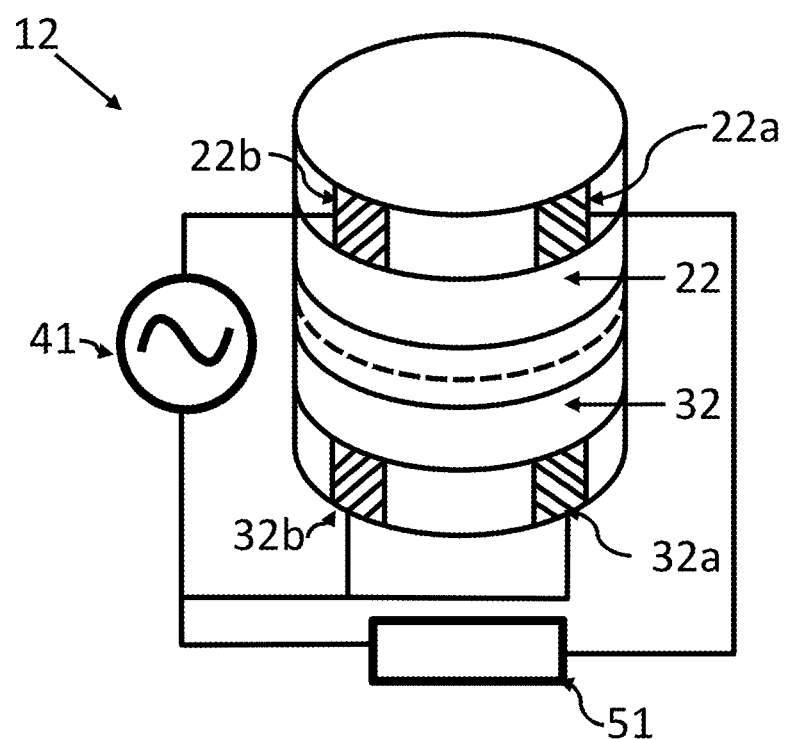
FIG. 8 shows a schematic illustration of a electrical device according to embodiments relating to the fifth aspect of the present invention.
Figure 9:
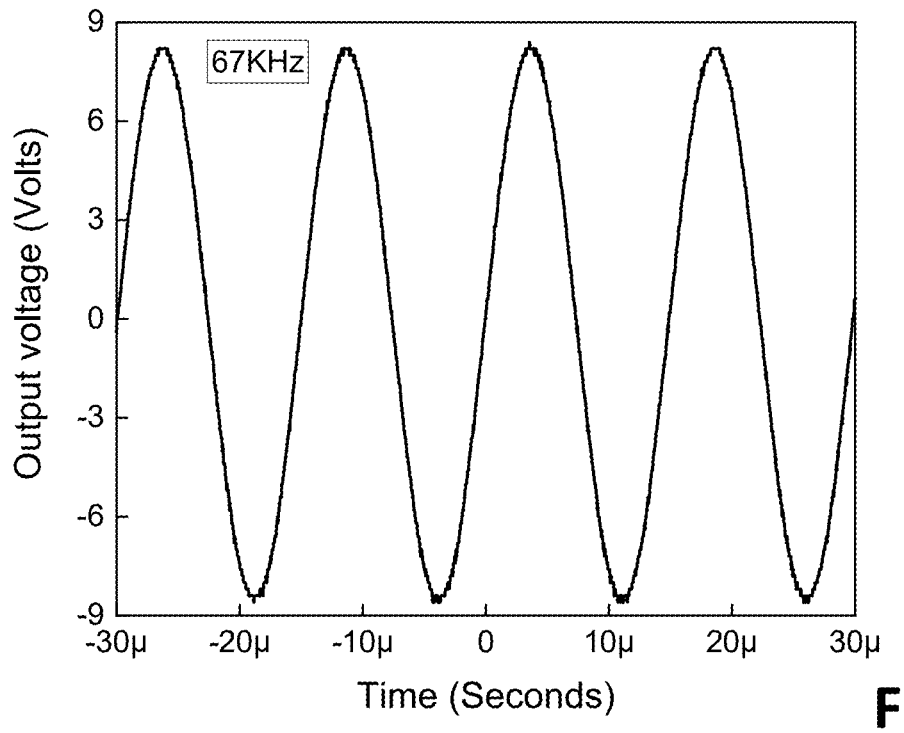
FIG. 9 shows a voltage measurement of a electrical device incorporating a Rosen-type piezoelectric transformer having a conventional electrode arrangement
Figure 10:
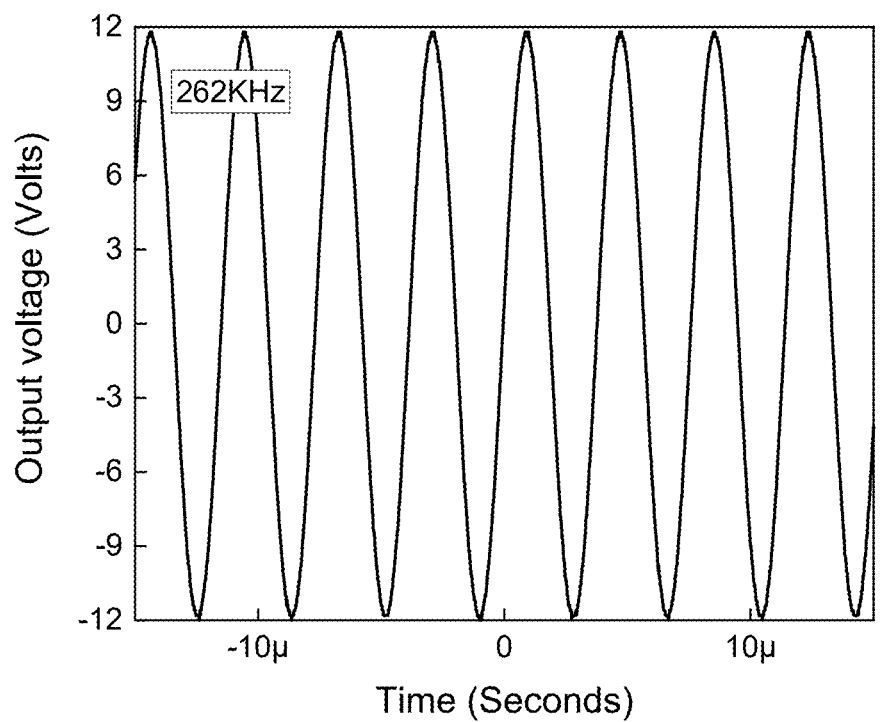
FIG. 10 shows a voltage measurement of a electrical device incorporating a Rosen-type piezoelectric transformer having a electrode arrangement according to the first and second aspect of the present invention.

According to a fifth aspect of the present invention illustrated in FIG. 8 there is proposed an electrical device 12 comprising a first piezoelectric element 22 coupled to a second first piezoelectric element 32 which together defines:
- a height dimension H;
- a length dimension L transverse to the height dimension H; and,
- a width dimension W transverse to both the length dimension L and height dimension H.

The first piezoelectric element 22 and second piezoelectric element 32 respectively comprises a set of piezoelectrical layers polarized and stacked in a direction parallel to the height dimension H.

A set of input electrodes 22a and a set of output electrodes 22b are arranged on the primary section 22a and a set of ground electrodes 32a, 32b are arranged on the secondary section 32.

The electrical device 12 further comprises an AC-voltage source 42 operatively connected to the set of input electrodes 22a and the set of ground electrodes 32 and an electrical load 52 coupled to the set of output electrodes 22a.

According to embodiments of the fifth aspect, the first piezoelectric element 22 and the second first piezoelectric element 32 are stacked in parallel to the height dimension to form a cylinder. The set of input electrodes 22a and a set of output electrodes 22b are preferably arranged in parallel to the height dimension on the primary section 22. The set of ground electrodes may then be arranged in parallel to the height dimension on the secondary section 32.

According to some embodiments, the first piezoelectric element 22 and the second first piezoelectric element 32 are mechanically coupled but electrically isolated.

In other words, the first piezoelectric element 22 and the second first piezoelectric element 32 may form a structure similar to that of a transor-type piezoelectric transformer having switched places between a ground electrode and a output electrode.

Alternatively, the first piezoelectric element 22 and the second first piezoelectric element 32 are mechanically and electrically coupled to form a single piezoelectric element.

According to embodiments of the fifth aspect the set of piezoelectric layers comprise only a single layer. Alternatively, the set piezoelectric layers comprise multiple layers as shown in FIG. 8. When multiple piezoelectric layers are incorporated it may be preferable that the polarization direction alternates between each adjacent piezoelectric layer.

EXAMPLES

Example 1. An electrical device (1) comprising a piezoelectric element (1a) defining: a height dimension (H); a length dimension (L) transverse to the height dimension (H); and, a width dimension (W) transverse to both the length dimension (L) and height dimension (H), and wherein the piezoelectric element (1a) comprises a primary section (2) and a secondary section (3), wherein the primary section (2) is polarized in a direction parallel to the height dimension (H) from a first face (2a) to a second face (2b), and wherein the secondary section (3) is polarized parallel to the length dimension (L); the piezoelectric device (1a) being characterized by:
- an set of input electrodes;
- and an set of output electrode, said set of input electrodes and set of output electrode being disposed on opposite faces of the primary section (2);
- a set of ground electrodes being disposed on the secondary section (3); and,
- wherein the electrical device (1) further comprises:
  - an AC-voltage source (4) operatively connected to the set of input electrodes and the set of ground electrode; and,
  - an electrical load (5) coupled to the set of output electrodes.

Example 2. An electrical device (1) comprising a piezoelectric element (1b) defining: a height dimension (H); a length dimension (L) transverse to the height dimension (H); and, a width dimension (W) transverse to both the length dimension (L) and height dimension (H), and wherein the piezoelectric element (1b) comprises a primary section (2) and secondary section (3), wherein the primary section (2) comprises multiple piezoelectric layers polarized in a direction parallel to the height dimension (H), and wherein the secondary section (3) is polarized in a direction parallel to the length dimension (L), the piezoelectric device (1b) being characterized by:
- a set of input electrodes;
- and a set of output electrodes, said set of input electrodes and set of output electrodes being interleaved between said multiple piezoelectric layers;
- a set of ground electrodes being disposed on the secondary section (3); and, wherein the electrical device (1) further comprises:
- an AC-voltage source (4) operatively connected to the set of input electrodes and the set of ground electrodes; and,
- an electrical load (5) coupled to the set of output electrodes.

Example 3. The electrical device (1) according to Example 1 or Example 2, wherein the set of ground electrodes is disposed on a third face (3a) which is the outermost face of the secondary section parallel to the width dimension (W) of the piezoelectric element (1a, 1c).

Example 4. The electrical device (1) according to any previous Example, wherein piezoelectric element (1a, 1c) is formed as a cuboid and wherein the length dimension (L) of the piezoelectric element (1a) is greater than the width dimension (W) and wherein the width dimension (W) of the piezoelectric element (1a) is greater than the height dimension (H), and wherein the piezoelectric element (1a) is divided along its length dimension (L) into the primary section (2) and the secondary section (3).

Example 5. The electrical device (1) according to Example 1, wherein the set of input electrodes, set of output electrodes and set of ground electrodes is composed by one electrode respectively.

Example 6. The electrical device (1) according to Example 1 or Example 5, wherein the primary section (2) is polarized either from the face on which the set of input electrode is arranged to the face on which the set of output electrode is arranged or in the opposite direction, and wherein or the secondary section (3) is polarized from either the middle face (3b) to the third face (3a); or, from the third face (3a) to the middle face (3b).

Example 7. The electrical device according to any previous Example, wherein the set of ground electrodes is connected to a common ground potential.

Example 8. The electrical device according to any previous Example, wherein the primary section (2) and secondary section (3) are composed by a single body.

Example 9. A method for using a piezoelectrical transformer, wherein the piezoelectric transformer comprising a piezoelectric ceramic element (1a, 1b) having a height dimension (H), length dimension (L) and width dimension (W) and wherein the piezoelectric element (1a) comprises a primary section (2) and secondary section (3), wherein the primary section (2) is polarized along the height dimension (H) from a first face (2a) to a second face (2b), and wherein the secondary section (3) is polarized along the length (L); the transformer being characterized by:
- an set of input electrodes being disposed on either the first face (4) or the second face (5);
- an set of output electrodes being disposed on the face opposite to the set of input electrode;
- a set of ground electrodes being disposed on a third face (6) being the outermost face of the second section parallel to the width dimension (W) of the piezoelectric element (1a, 1b); and,
- wherein the method comprises at least the steps of:
  - applying an input AC-voltage to be transformed to the set of input electrodes and the set of ground electrode; and,
  - extracting an output voltage from the set of output electrode.

Example 10. A electrical device (10, 11) comprising a piezoelectric element (10a, 11a) defining: a height dimension (H); a length dimension (L) transverse to the height dimension (H); and, a width dimension (W) transverse to both the length dimension (L) and height dimension (H), and wherein the piezoelectric element (10a, 11a) comprises a set of piezoelectrical layers polarized and stacked in a direction parallel to the height dimension (H), and wherein the piezoelectric element (10a, 10a) comprises a primary section (20, 21) and a secondary section (30, 31), wherein the electrical device (10, 11) is characterized by:
- a set of input electrodes (20a, 21a) and a set of output electrodes (20b, 21b) being arranged on the primary section (20, 21);
- a set of ground electrodes (30a, 30b, 31a) being arranged on the secondary section (30, 31); and,
- wherein the electrical device (10, 11) further comprises:
  - an AC-voltage source (40, 41) operatively connected to the set of input electrodes (20a, 21a) and the set of ground electrodes (30a, 30b, 31a); and,
  - an electrical load (50, 51) coupled to the set of output electrodes (20b, 21b).

Example 11. The electrical device (10) according to Example 10, wherein the piezoelectric element (10a) is formed as a cuboid and wherein the length dimension (L) of the piezoelectric element (1a) is greater than the width dimension (W) and wherein the width dimension (W) of the piezoelectric element (10a) is greater than the height dimension (H), and wherein the piezoelectric element (10a) is divided along its length dimension (L) into the primary section (20a) and the secondary section (30), wherein the set of input electrodes (20a) and the set of output electrodes (20b) are arranged on opposite faces parallel to the length dimension (L) on the primary section (20a) and wherein the set of ground electrodes (30a, 30b) are arranged on at least one face parallel to the length dimension (L) on the secondary section (30).

Example 12. The electrical device (11) according to Example 10, wherein piezoelectric element (11a) is divided along its height dimension (H) into the primary section (21) and the secondary section (31), wherein the set of input electrodes (21a) and the set of output electrodes (20b) are arranged on the face parallel to width dimension (W) on the primary section (21) and wherein the set of ground electrodes (30a) are arranged on the face parallel to the width dimension (W) on the secondary section (31).

Example 13. A electrical device (12) comprising a first piezoelectric element (22) coupled to a second first piezoelectric element (32) which together defines: a height dimension (H); a length dimension (L) transverse to the height dimension (H); and, a width dimension (W) transverse to both the length dimension (L) and height dimension (H), and wherein the first piezoelectric element (22) and second piezoelectric element (32) comprises a set of piezoelectrical layers polarized and stacked in a direction parallel to the height dimension (H), wherein the electrical device (12) is characterized by:

1 a set of input electrodes (22a) and a set of output electrodes (22b) being arranged on the primary section (22);

a set of ground electrodes (32a, 32b) being arranged on the secondary section (32);

and, wherein the electrical device (12) further comprises:

an AC-voltage source (42) operatively connected to the set of input electrodes (22a) and the set of ground electrodes (32); and, an electrical load (52) coupled to the set of output electrodes (22a).

Example 14. The electrical device (12) according to Example 13, wherein the first piezoelectric element (22) and the second first piezoelectric element (32) are stacked in parallel to the height dimension to form a cylinder, and wherein the set of input electrodes (22a) and a set of output electrodes (22b) are arranged in parallel to the height dimension on the primary section (22); and, wherein the set of ground electrodes are arranged in parallel to the height dimension on the secondary section (32).

Example 15. The electrical device (12) according to Example 13 or 14, wherein the first piezoelectric element (22) and the second first piezoelectric element (32) are mechanically coupled but electrically isolated.

Definitions

As used herein, the term 'electrical load' shall be understood to include any apparatus, instrument, circuit, network, or system that draws, dissipates, or otherwise makes use of electrical current or voltage. This term is not limited to passive components (e.g., purely resistive, inductive, or capacitive elements) but equally covers active, reactive, or non-linear devices, as well as energy-storage or power-conversion circuits, regardless of their function or end application.

In one embodiment, the load (5) may be any electrical load is either a Cold Cathode Fluorescent Lamp (CCFL) or an ultrasonic transducer Additionally, the term 'AC-voltage source' shall be understood to include any device or assembly configured to provide a non-constant (e.g., alternating, periodically reversing, modulated, or otherwise time-varying) electrical potential. This includes but is not limited to sources generating sinusoidal, square, triangular, sawtooth, pulsed, or multi-phase waveforms, whether delivered via mechanical alternators, inverters, function generators, rotating machines, electronic circuits, or any other suitable arrangement. The term further encompasses any such source regardless of frequency range (e.g., from extremely low to radio-frequency or higher), load-driving characteristics, or presence of a DC offset.

The term 'piezoelectrical element' refers to piezoelectric material forming a monolith structure with or without an intermediate thin adhesive layer between sections or layers. In other words, the piezoelectric sections or layers may be sintered together, bonded by thin adhesive film (e.g., epoxy or glass frit) formed using co-firing processing creating an integral structure.

While the present invention has been described with reference to specific exemplifying embodiments, the description is generally only intended to illustrate the inventive concept and should not be taken as limiting the scope of the solution.

It will be appreciated that the foregoing description and the accompanying drawings represent non-limiting examples of the method and arrangement taught herein. As such, the arrangement and techniques taught herein are not limited by the foregoing description and accompanying drawings. Instead, the embodiments herein are limited only by the following claims and their legal equivalents.

The invention claimed is:

1. An electrical device comprising a piezoelectric element defining: a height dimension; a length dimension transverse to the height dimension; and, a width dimension transverse to both the length dimension and height dimension, and wherein the piezoelectric element comprises a primary section and a secondary section, wherein the primary section is polarized in a direction parallel to the height dimension from a first face to a second face, and wherein the secondary section is polarized parallel to the length dimension; the piezoelectric element being characterized by:

one or more input electrodes;

and one or more output electrodes, said one or more input electrodes and one or more output electrodes being disposed on opposite faces of the primary section;

one or more ground electrodes being disposed on the secondary section; and, wherein the electrical device further comprises:

an AC-voltage source operatively connected to the one or more input electrodes and the one or more ground electrodes; and, an electrical load coupled to the one or more output electrodes.

2. The electrical device according to claim 1, wherein the one or more ground electrodes is disposed on a third face which is an outermost face of the secondary section parallel to the width dimension of the piezoelectric element.

3. The electrical device according to claim 1, wherein the piezoelectric element is formed as a cuboid and wherein the length dimension of the piezoelectric element is greater than the width dimension and wherein the width dimension of the piezoelectric element is greater than the height dimension, and wherein the piezoelectric element is divided along its length dimension into the primary section and the secondary section.

4. The electrical device according to claim 1, wherein each of the one or more input electrodes, the one or more output electrodes and the one or more ground electrodes is composed of one electrode respectively.

5. The electrical device according to claim 1, wherein the primary section is polarized either from the face on which the one or more input electrodes is arranged to the face on which the one or more output electrodes is arranged or in the opposite direction, and wherein or the secondary section is polarized from either a middle face to a third face; or, from the third face to the middle face.

6. The electrical device according to claim 1, wherein the one or more ground electrodes is connected to a common ground potential.

7. The electrical device according to claim 1, wherein the primary section and secondary section are composed by a single body.

8. An electrical device comprising a piezoelectric element defining: a height dimension; a length dimension transverse to the height dimension; and, a width dimension transverse to both the length dimension and height dimension, and wherein the piezoelectric element comprises a primary section and secondary section, wherein the primary section comprises multiple piezoelectric layers polarized in a direction parallel to the height dimension, and wherein the secondary section is polarized in a direction parallel to the length dimension, the piezoelectric element being characterized by:
one or more input electrodes;
and one or more output electrodes, said one or more input electrodes and one or more output electrodes being interleaved between said multiple piezoelectric layers;
one or more ground electrodes being disposed on the secondary section; and, wherein the electrical device further comprises:
an AC-voltage source operatively connected to the one or more input electrodes and the one or more ground electrodes; and,
an electrical load coupled to the one or more output electrodes.

9. The electrical device according to claim 8, wherein the one or more ground electrodes is disposed on a third face which is an outermost face of the secondary section parallel to the width dimension of the piezoelectric element.

10. The electrical device according to claim 8, wherein piezoelectric element is formed as a cuboid and wherein the length dimension of the piezoelectric element is greater than the width dimension and wherein the width dimension of the piezoelectric element is greater than the height dimension, and wherein the piezoelectric element is divided along its length dimension into the primary section and the secondary section.

11. The electrical device according to claim 8, wherein the one or more ground electrodes is connected to a common ground potential.

12. The electrical device according to claim 8, wherein the primary section and secondary section are composed by a single body.

13. A method for using a piezoelectrical transformer, wherein the piezoelectric transformer comprising a piezoelectric ceramic element having a height dimension, length dimension and width dimension and wherein the piezoelectric element comprises a primary section and secondary section, wherein the primary section is polarized along the height dimension from a first face to a second face, and wherein the secondary section is polarized along the length; the transformer being characterized by:
one or more input electrodes being disposed on either the first face or the second face;
one or more output electrodes being disposed on the face opposite to the one or more input electrodes;
one or more ground electrodes being disposed on a third face being an outermost face of the second section parallel to the width dimension of the piezoelectric element; and,
wherein the method comprises at least the steps of:
applying an input AC-voltage to be transformed to the one or more input electrodes and the one or more ground electrodes; and,
extracting an output voltage from the one or more output electrodes.

14. A electrical device comprising a piezoelectric element defining: a height dimension; a length dimension transverse to the height dimension; and, a width dimension transverse to both the length dimension and height dimension, and wherein the piezoelectric element comprises a set of piezoelectrical layers polarized and stacked in a direction parallel to the height dimension, and wherein the piezoelectric element comprises a primary section and a secondary section, wherein the electrical device is characterized by:
one or more input electrodes and one or more output electrodes being arranged on the primary section;
one or more ground electrodes-being arranged on the secondary section; and,
wherein the electrical device-further comprises:
an AC-voltage source operatively connected to the one or more input electrodes and the one or more ground electrodes; and,
an electrical load coupled to the one or more output electrodes.

15. The electrical device according to claim 14, wherein the piezoelectric element is formed as a cuboid and wherein the length dimension of the piezoelectric element is greater than the width dimension and wherein the width dimension of the piezoelectric element is greater than the height dimension, and wherein the piezoelectric element is divided along its length dimension into the primary section and the secondary section, wherein the one or more input electrodes and the one or more output electrodes are arranged on opposite faces parallel to the length dimension on the primary section and wherein the one or more ground electrodes are arranged on at least one face parallel to the length dimension on the secondary section.

16. The electrical device according to claim 14, wherein piezoelectric element is divided along its height dimension into the primary section and the secondary section, wherein the one or more input electrodes and the one or more output electrodes are arranged on a face parallel to width dimension on the primary section and wherein the one or more ground electrodes are arranged on the face parallel to the width dimension on the secondary section.

* * * * *